United States Patent
Koenig et al.

(10) Patent No.: US 7,644,487 B2
(45) Date of Patent: Jan. 12, 2010

(54) MECHANISM OF PRODUCING A CONDUCTOR PATTERN ON A SUBSTRATE

(75) Inventors: Martin Koenig, Munich (DE); Karlheinz Bock, Germering (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 21 days.

(21) Appl. No.: 11/857,532

(22) Filed: Sep. 19, 2007

(65) Prior Publication Data

US 2008/0068280 A1    Mar. 20, 2008

Related U.S. Application Data

(63) Continuation of application No. PCT/EP2006/002633, filed on Mar. 22, 2006.

(30) Foreign Application Priority Data

Apr. 11, 2005    (DE) .................. 10 2005 016 511

(51) Int. Cl.
*H01Q 1/40* (2006.01)
(52) U.S. Cl. ................... 29/600; 259/676; 259/692; 259/E23.043; 430/110; 438/118
(58) Field of Classification Search ............ 29/600; 259/676, 692, E23.043; 430/110; 438/118
See application file for complete search history.

(56) References Cited

U.S. PATENT DOCUMENTS

| 4,261,286 | A | * | 4/1981 | Kupfer ..................... 118/202 |
|---|---|---|---|---|
| 4,792,790 | A | | 12/1988 | Reeb |
| 4,935,093 | A | | 6/1990 | Reeb |
| 5,264,656 | A | | 11/1993 | Itakura et al. |
| 5,294,290 | A | | 3/1994 | Reeb |
| 6,618,939 | B2 | * | 9/2003 | Uchibori et al. ............... 29/846 |
| 6,693,541 | B2 | * | 2/2004 | Egbert .................... 340/572.7 |
| 6,816,125 | B2 | * | 11/2004 | Kuhns et al. ................ 343/880 |

FOREIGN PATENT DOCUMENTS

| DE | 32 21 500 A1 | 12/1983 |
|---|---|---|
| DE | 198 37 217 A1 | 3/2000 |
| DE | 103 35 015 A1 | 2/2005 |
| GB | 1106750 A | 3/1968 |
| JP | 03-259300 A | 11/1991 |
| JP | 09-064512 A | 3/1997 |
| WO | 2005/015967 A1 | 2/2005 |

OTHER PUBLICATIONS

English Translation of the official communication issued in counterpart International Application No. PCT/EP2006/002633, mailed on Dec. 27, 2007.
Official communication issued in International Application No. PCT/EP2006/002633, mailed on Jul. 13, 2006.
English Abstract of DE 198 37 217; Kind Code: A1; Published on Mar. 2, 2000.

\* cited by examiner

*Primary Examiner*—Derris H Banks
*Assistant Examiner*—Dan D Le
(74) *Attorney, Agent, or Firm*—Keating & Bennett, LLP

(57) ABSTRACT

In a method of producing a conductor pattern on a substrate and, in particular, of producing RFID labels, the conductive base material and the substrate material are initially provided, further the conductive base material is punched to obtain a conductor pattern and a residual base material. The conductor pattern is connected to the substrate material, and the residual base material is removed.

16 Claims, 5 Drawing Sheets

US 7,644,487 B2

MECHANISM OF PRODUCING A CONDUCTOR PATTERN ON A SUBSTRATE

CROSS-REFERENCE TO RELATED APPLICATIONS

This application is a continuation of copending International Application No. PCT/EP2006/002633, filed Mar. 22, 2006, which designated the United States and was not published in English.

BACKGROUND OF THE INVENTION

1. Field of the Invention

The present invention relates to a method of producing a conductor pattern, or structure, on a substrate and in particular to a method for punching a conductive base material in order to obtain a patterned, or structured, conductor pattern connected to a substrate, where the conductor pattern particularly may be an antenna pattern, or structure, for an RFID label for an RFID system (RFID=radio frequency identification).

2. Description of the Related Art

Identification systems and particularly wireless identification systems such as barcode systems, OCR systems (OCR=optical character recognition) or RFID systems have become more and more widespread. Applications are for example identification systems especially for personal identification, animal identification, brand and product protection, logistics, automobile anti-theft devices, security locking systems etc.

RFID systems work in a frequency range of about one hundred kHz up to some 10 GHz. RFID systems are not affected by pollution or wear since no mechanical contacts are present, and, in contrast to barcode systems and OCR systems, do not need an optical connection. Moreover, several data carriers may be read simultaneously at high speed and, depending on the RFID system, the information on the data carrier may even be changed.

In general, RFID system are realized as transponder systems and essentially comprise two different components, one or several RFID transponders, also referred to as RFID data carrier, RFID label or RFID tag and e.g. are mounted on the objects to be identified, and an RFID base station which depending on the RFID system is configured to be either a reader or reader and writer and which may read out the data from the RFID transponder and may possibly change the data by means of write-in.

An RFID transponder in turn fundamentally consists of an integrated circuit that takes over the editing and processing for transmitting and receiving or respectively coding and decoding the data as well as all further functions, such as the storage of the identification number or the data encryption, and an antenna for wireless communication with the RFID base station. The integrated circuit of the RFID transponder is also referred to as RFID transponder chip or RFID transponder IC (IC=integrated circuit), the antenna is also referred to as RFID antenna pattern.

All components of the RFID transponder including the RFID antenna pattern are arranged on a substrate and protected from environmental influences by covering foils or a housing.

RFID transponder systems may be classified in a number of ways. An important distinguishing feature is the type of energy supply of the RFID transponder. Here a division takes place into passive and active systems.

An RFID transponder having an internal energy supply is described as active. The batteries (flexible flat cells, button cells, etc.) e.g. contained in active RFID transponders allow the additional operation of micro controllers for processing and storing comprehensive data. Thus the integration of sensors to measure temperature, pressure and shocks (impacts) is gaining increased importance. In this way, miniaturized data loggers for recording data may be realized which in the form of smart label of smart card present a low-cost alternative to established systems. Similar to smart cards, these RFID transponders may be supplemented with further elements such as displays or keyboards in order to increase their functionality.

Active RFID transponders are currently produced for transmission frequencies of 125 kHz, 135 kHz, 13.56 MHz, 433 MHz, 868 MHz, 915 MHz and 2.45 GHz, so that the ranges of active RFID transponders lie between several meters and up to 100 m.

An RFID transponder is referred to as passive when it is supplied with energy via an external predominantly magnetic or electromagnetic field. In most RFID systems the energy supply and data transmission takes place via an inductive, i.e. magnetic coupling between the RFID transponder the and RFID base station.

Due to the external energy supply of passive RFID transponders, their architecture may be made very simple and thus cost-effective. An RFID transponder based on inductive coupling mostly consists of only one RFID transponder chip which is connected to an antenna patterned on a substrate. This embodiment, in particular, is referred to as RFID label.

Most passive RFID systems work at frequencies of 125 to 135 KHz and 13.56 MHz. The range is limited to about 1.5 m. There are also other passive RFID systems that work at higher frequencies, e.g. 868 MHz or 915 MHz.

One field of application for RFID labels is the production of security packaging for highly expensive products. On the inside of security packaging, a copper grid or a copper strip may be found. The copper grid or the copper strip have a defined resistance. When the packaging is opened and the copper grid or the copper strip is torn, the resistance approaches infinity which the RFID transponder chip registers and saves along with the date and the time. With the help of this technology it is possible to precisely determine whether the product was removed from the packaging only at the customer's end or whether the product was stolen during transport or at the manufacturer's company. The simplest security packaging consists of an RFID antenna pattern glued across the opening area of the packaging. As soon as the packaging is torn open, the RFID antenna pattern is destroyed and the write/read function of the RFID label is thereby inactivated. The field of application for security packaging are high-value goods such as cell phones and medicine.

Further applications for RFID systems in the MHz and GHz ranges are the guarantee of counterfeit-proof identification cards, entrance tickets, authorization IDs and bills. In this field, the integration of a 2.4 GHz RFID transponder into a 200 Euros bill is currently under consideration. In a bill, a modified aluminum security thread which suffices for a working frequency of 2.4 GHz may serve as an antenna. The advantage of such RFID transponders that work at considerably more short-wave frequencies than 13.56 MHz is that a much more compact design of the antenna is possible. While at 13.56 MHz multi-loop RFID antenna patterns are still needed, a single loop suffices for 800 MHz and higher frequencies.

The mechanical structure and the quality, in particular the grade, of RFID antenna patterns are of considerable importance for the utilizability and the reliability of the entire RFID system. It is true that the size and the number of loops of the RFID antenna pattern may be reduced, however only with the disadvantage that performance and reliable data transmission will suffer. In much the same way, the conductivity and the resistivity of the materials of the RFID antenna pattern play decisive roles in terms of the grade of the coil. The lower the resistance of the material of the RFID antenna pattern, the higher the grade and the associated range and guarantee of an error-free data transmission between the RFID label and the RFID base station.

RFID label production may be subdivided into three production sections, i.e. producing the RFID transponder chip, producing an RFID antenna label consisting of the RFID antenna pattern comprising mostly copper or aluminum and consisting of a substrate material, and placing the transponder chip onto the RFID antenna pattern.

Producing RFID labels has so far been a costly and high-effort technology, wherein mostly very expensive methods and, thus, a very large number of production steps using a large number of different production machines have been needed. This results in very high investment costs for a continuous production plant for RFID labels. There are currently three relevant traditional approaches to RFID antenna production which are based on screen printing, etching or sputtering/electroplating techniques.

The chart below depicts a summary of the essential production steps of the above-mentioned production techniques. Following that, a detailed description will be given of the individual production techniques and their disadvantages or problems.

| Etching technique | Screen-printing technique | Electroplating/ Sputtering |
|---|---|---|
| coil design using CAD | coil design using CAD | coil design using CAD |
| mask fabrication | sheet film fabrication | sheet film fabrication |
| coating the copper tape with photoresist | printing silver conductor paste onto PET tape | printing silver conductor paste onto PET tape or generally conductive material |
| photoresist exposure | drying the silver conductor paste | drying the silver conductor paste |
| photoresist development + cleaning of the surface | | galvanic reinforcement + cleaning and drying |
| etching copper + cleaning surface | | |
| stripping copper + cleaning surface | | |

What follows now is a description of the etching technique. The etching technique necessitates a very large number of processing and/or production steps so as to pattern a foil, the whole area of which is clad, e.g., with copper. Because of the strong inclination of the copper to form surface oxidations, the top copper surface has a tarnish protection located thereon which is removed, prior to the etching operation, using a solvent or a cleaning brush, e.g. in the form of a pumice stonemeal brush. In the first step, the copper surface is coated with a photosensitive lacquer, for example by laminating on a solid resist, by curtain coating, spray coating or roller coating. Subsequently, the photoresist is exposed, using an exposure tool and a photo mask, in those areas where the photoresist is to protect the copper surface. This technique is also referred to as a negative-resist system, or as a negatively operating system. In this context, the photoresist is cross-linkable at a UV radiation of 350 nm. The third step comprises developing the photoresist within the developing unit, mostly using sodium carbonate as the developing solution. Here, the non-exposed areas are washed away from the copper surface and are thus accessible for the etching solution. Subsequently, the non-protected areas are etched away within the etching system, for example using iron trichloride (FeC13) or sodium peroxodisulfate (Na2S04). In the last step, the remaining photoresist is washed away, mostly using potassium hydroxide (KOH), and the surface is cleaned in a rinsing cascade with deionized water so as to neutralize any alkaline or acid surface contaminations to avoid a high level of surface oxidation.

However, these etching techniques have severe disadvantages or are problematic for the following reasons. A very large number of different machines are needed, for example, a laminator, an exposure unit, a developer, an etcher and a stripper, so that high investment cost is needed. In addition, wet-chemical processes are used wherein the waste water must be treated in a time-consuming and costly manner so as to remove the copper ions, which represent a hazard to the water, from the rinse water.

What follows is a description of the screen printing technique. In screen printing, a conductive paste, e.g. a silver conductor paste, is printed through a patterned screen onto the substrate material using a squeegee. The screen is produced using a sheet film and a screen exposure unit. The screen is permeable to the conductor paste in all those locations which are not covered by the screen coating, i.e. the photoresist. The conductive paste is cured in a drying section at a specific temperature from about 120 to 160° C.

Screen printing has several disadvantages, or is problematic for the following reasons. The silver conductor pastes are very expensive and additionally, the conductance of the RFID antenna pattern fabricated therewith is low, so that as a result, the grade and range of the RFID antenna pattern is relatively poor. In addition, the service life of such screens for screen printing techniques is short.

What follows is a description of sputtering. In sputtering by means of a shadow mask, an RFID antenna pattern may be fabricated directly on the surface of the substrate material. What is disadvantageous about this technology are the high costs of a sputtering system and, additionally, the high cost of operating and maintaining the system. A good conductive layer for an RFID antenna pattern may be fabricated only when a minimum concentration of foreign atoms is present within the sputtering system, which means, in turn, that a high vacuum must be generated, which is also compulsory for the sputtering process itself. However, despite the high expenditure, only very thin metal layers, typically within a range of several nm, can be fabricated using a sputtering process. This means that the inductance, or ability to carry current, of the RFID antenna pattern generated by means of sputtering is very small (as in the stamping technique to be described below). If a higher level current-carrying ability or a higher level of inductance is needed, the thin, sputtered RFID antenna pattern first needs to be reinforced in an additional production step by means of an expensive and wet-chemical electroplating process.

What follows is a description of stamping. In stamping, a very thin copper, aluminum or gold layer is applied to the surface of the substrate material using a hot-stamping die for generating an RFID antenna pattern.

What is disadvantageous or problematic about the technique of stamping is that only extremely thin metallic layers within the range of several micrometers may be processed, and that the resulting conductor patterns thus exhibit very poor electric characteristics, such as low conductivity. In addition, stamping operations inherently cannot fabricate any homogenous, smooth contours on the resulting conductor patterns.

In summary, the above-mentioned production techniques are problematic for various reasons. For example, they are very expensive with regard to the multi-stage production process and the variety of process steps, where sometimes only sequential methods are possible and the conductor patterns or RFID antenna patterns produced exhibit poor quality and performance, in particular when using screen printing and the stamping technique. If the etching technique or a an electroplating bath is used, the expenditure and the cost of ensuring the waste-water purification with regard to the wet chemistry also have disadvantageous effects. The production techniques are therefore, in summary, very costly with regard to the fabrication of the conductor patters, in particular for mass production of RFID antenna patterns.

Therefore, because of the above-mentioned problems with regard to very high-effort, costly production methods, RFID systems have so far not been able to become accepted on the market as a mass product in the low-cost segment despite their various possibilities of application and advantages over other wireless identification systems.

Document U.S. Pat. No. 6,618,939 relates to a method for producing resonant tags, a metal foil being stamped out, or punched out, using a thermal adhesion adhesive, on at least one face of the foil into circuit-like molds, and is adhered to a base foil. The method comprises: stamping out parts of metal foils, shaped in a predefined manner, from a metal foil while the latter is guided through a die roll having a stamping blade of a predefined shape, and a transfer roll which is in contact with the die roll and is also employed as a support roll, holding this metal foil portion obtained by the stamping out on the surface of the transfer roll by means of suction holes formed in the transfer roll; and thermally adhering the stamped metal foil portion to the base foil between the transfer roll on its other face and an adhesive roll.

SUMMARY OF THE INVENTION

According to an embodiment, a method of producing an RFID antenna pattern (RFID=radio frequency identification) on a substrate may have the steps of: providing a composite body having a layer pattern made consisting of a conductive base material, an adhesive, and a substrate material, the adhesive being located between the base material and the substrate material, and the conductive base material having a thickness ranging from 20 μm to 200 μm; punching the conductive base material to obtain a patterned conductive base material having the RFID antenna pattern and a residual base material; connecting the RFID antenna pattern to the substrate material; and removing the residual base material from the composite body, the removal of the residual base material being performed by means of a peel-off cleaning brush, a metal blade or by a compressed-air cleaning unit.

According to another embodiment, a method of producing an RFID antenna pattern (RFID=radio frequency identification) on a substrate may have the steps of: providing a conductive base material; providing a substrate material; punching the conductive base material to obtain a patterned conductive base material having the RFID antenna pattern and a residual base material, the RFID antenna pattern and the residual base material being interconnected by means of one or more mechanical links by the punching, the mechanical links being configured to fix the RFID antenna pattern with regard to the residual base material so as to be able to feed the RFID antenna pattern to a subsequent method step in such a manner that it is spatially fixed and retains its shape; connecting the RFID antenna pattern to the substrate material; and removing the residual base material, the removal of the residual base material being performed by means of a cleaning brush, a peel-off metal blade or by a compressed-air cleaning unit.

The present invention provides a method of producing a conductor pattern on a substrate, comprising: providing a conductive base material; providing a substrate material; punching the conductive base material to obtain a patterned conductive base material comprising the conductor pattern and a residual base material; connecting the conductor pattern to the substrate material; and removing the residual base material.

A finding of the present invention is that very high-quality RFID antenna patterns may be produced at relatively low expenditure and at relatively low cost by the inventive production technique by means of punching.

In principle, any punching methods may be employed for the inventive method, the present invention being described essentially with regard to roll punching and sequential punching.

In one embodiment of the inventive method, the punching step is performed, for example, by means of rotary, or roll, punching. In contrast to sequential punching, wherein the materials to be punched are fed "in batches", rotary punching enables continuous punching. Roll punching is therefore a continuous and fast-operating method having a high throughput which, at a high level of accuracy, simultaneously reduces not only the production cost of the conductor pattern, but also the machine invest.

A low-cost, fast production method also exhibiting low machine invest enables economic production even of small batches.

In some cases it may, nevertheless, be useful to employ punching presses (toggle press, hydraulic press) which work sequentially, be it for reasons of small batches, patterns, prototype construction, production-technological background, or that one falls back on existing hydraulic presses for investment reasons.

All of the advantages and embodiments which have been mentioned above and will become apparent later on from the description therefore apply both to roll punching and to sequential punching.

Due to the high production speeds and the simple one-stage production method, a low production price for conductor patters and, thus, for antenna patterns for RFID labels is foreseeable for roll punching. Using a roll punch, both copper and aluminum or other metals and/or nonferrous metals may be patterned. With the etching technique, however, the etching media must match the material to be etched. Changing the etching media represents higher monetary expenditure, since the etching system must be run in anew.

In addition, in the inventive method there are no waste-water disposal problems as there are in etching, the punching technique is thus substantially more friendly to the environment ("green label"), suction systems for solvents or toxic vapors are not necessary when using a punch.

Due to the low investment requirements involved in a roll-to-roll punch, cost-covering or economic production of conductor patterns, and therefore of labels, is possible even for small batches.

Advantageously, in an inventive method the conductive base material may be fabricated, for example, in the form of a foil or a tape, be fed to a punching assembly and in the process may be punched in those areas where the conductor pattern is produced. The conductor base material may have thicknesses in the range of 30 μm and beyond, and advantageously in the range of from 20 μm to 200 μm and highly advantageously from 30 μm to 100 μm. The punching assembly may be configured both for roll punching and for sequential punching.

The conductive base material and/or the substrate material is previously wetted, for example with an adhesive layer so that the punched-out conductor pattern may be connected to a carrier, the substrate material, and may thus be fixed on the carrier material while retaining its shape. Subsequently, the residual base material is removed, for example scraped off using a rotating brush. The adhesive used may be, for example, thermoplastic adhesives or pressure-sensitive adhesives. In addition, other methods than gluing may naturally also be used for fixing and/or connecting.

An essential advantage of roll punching or sequential punching is that in the paper and packing industry, both punching methods are technically controllable and established methods of individually shaping paper, cardboard or foils, and/or to cut them to lengths needed.

In accordance with the invention, conventional rotary punches used to pattern, or structure, paper or other large-area substrate materials may be employed for punching the conductive base material, such as copper. An essential difference from the conventional punching devices is revealed, for example, in the respective tool design which depends on the material used and the antenna pattern to be produced, and will be described in more detail below.

A roll punch for patterning a conductive base material thus offers various advantages. What is mainly to be mentioned here are the conductor patterns having thicknesses in the range of 30 μm and beyond, and the favorable electrical characteristics resulting therefrom, such as the high quality of the RFID antenna patterns, the high throughput in production, the low investment cost, a low machine invest, in particular when it is possible to fall back on existing systems, the possibility of constructing the production machines in a compact manner, and the advantage of a low-cost, one-stage and continuous production method for a conductor pattern, and, in particular, an RFID antenna pattern which may additionally have a continuously operating placement unit integrated therein. In addition, a roll punch may be readily integrated into existing production systems of the paper and packaging industries, since very high processing speeds are possible, as are demanded by the paper-processing industry, and since, in addition, no wet chemistry is necessary.

In addition, there is no issue concerning any problematic disposal of the waste products ("green label"), since the residual base material is of one type only and does not come up in the form of a solution as in etching or in electroplating.

BRIEF DESCRIPTION OF THE DRAWINGS

Embodiments of the present invention will be detailed subsequently referring to the appended drawings, in which.

DETAILED DESCRIPTION OF PREFERRED EMBODIMENTS

Figure 4:
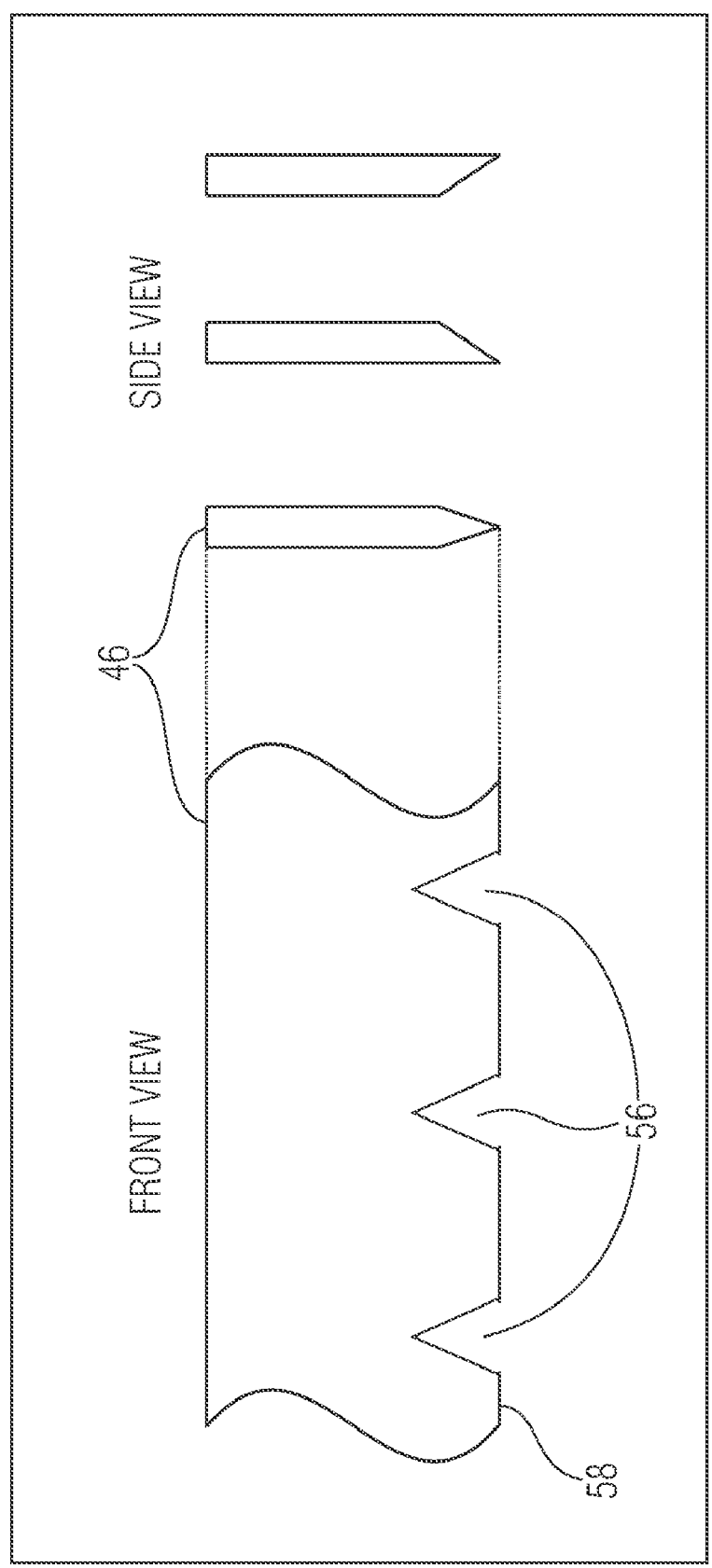
FIG. 4 is a schematic detailed partial representation of a punching assembly in the form of a punching blade comprising indentations for utilization in the inventive method of producing a pattern on a substrate.

A description will be given below, by way of example, of the inventive method of producing a conductor pattern by means of punching, with reference to FIGS. 1 and 4, initially using a roll punch method, the following explanations illustrating that the inventive procedure is applicable essentially for all punching methods and, in particular, also to sequential punching methods.

Figure 1:
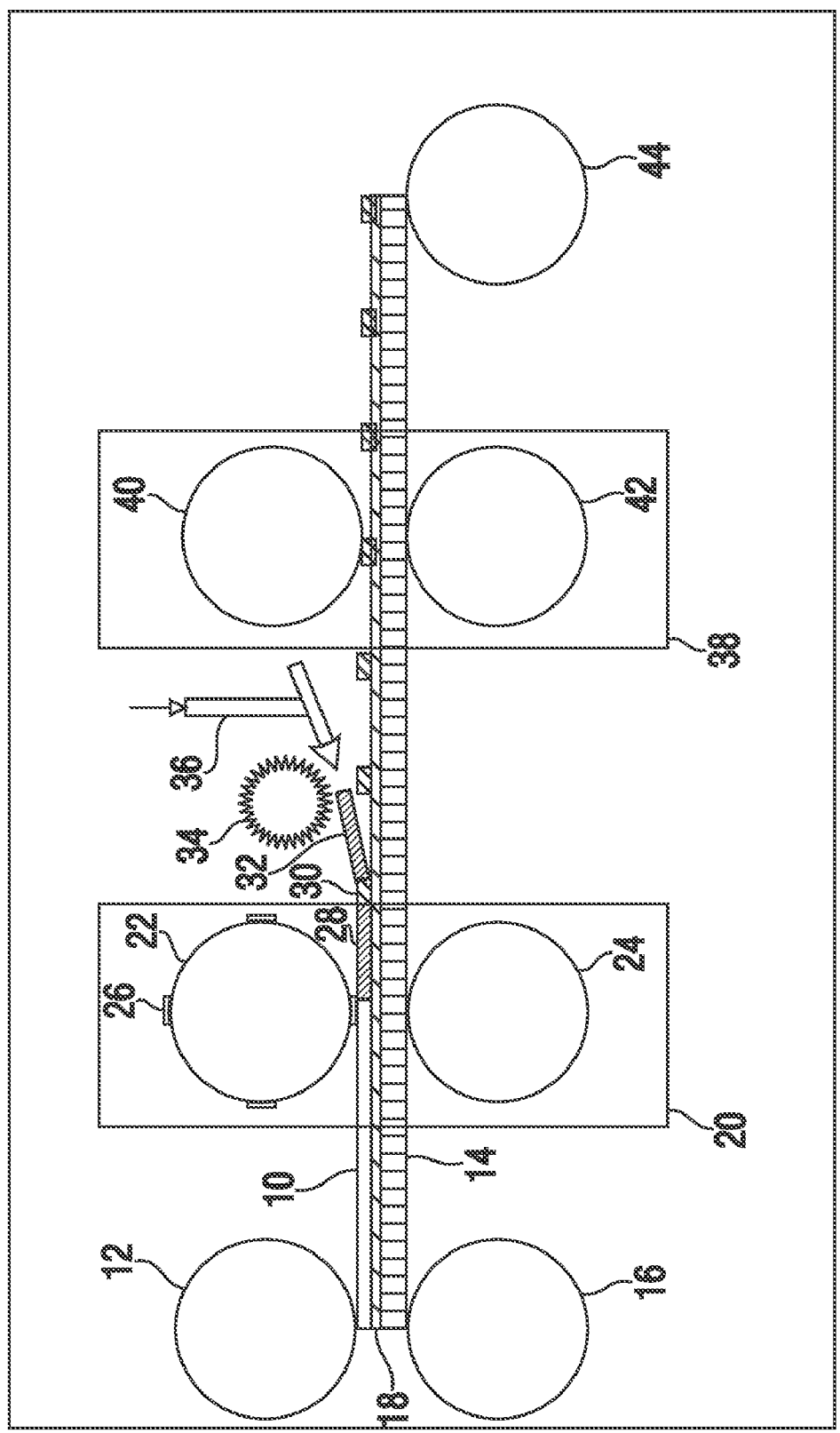
FIG. 1 shows, in the form of a schematic representation, an advantageous embodiment of the inventive method of producing a conductor pattern on a substrate.

In the form of a schematic representation, FIG. 1 shows a first advantageous embodiment of the inventive method of producing a conductor pattern on a substrate, wherein the step of punching is performed by means of roll punching, and the various steps of the production method are undergone from the left to the right with regard to the representation in FIG. 1.

In an advantageous embodiment of the present invention, a conductive base material 10, a reel-off unit 12 comprising the conductive base material 10, a substrate material 14, a reel-off unit 16 comprising the substrate material 14, and an adhesive 18 (e.g. in the form of an adhesive layer) located between the conductive base material 10 and the substrate material 14, are provided. The adhesive 18 may have already been applied, for example, to the substrate material 14 and/or the conductive base material 10 by means of wetting.

In addition, FIG. 1 shows a punching assembly 20, here a roll punch assembly, comprising a punching drum 22 and a counterpressure assembly 24 in the form of a counterpressure drum, the punching drum 22 comprising a punching tool 26. The punching assembly 20 is fed the conductive base material 10 and the substrate material 14 along with the adhesive 18, i.e. between the punching drum 22 and the counterpressure assembly 24. By the punching step, a patterned conductive base material 28 is produced from the conductive base material 10, said patterned conductive base material 28 then comprising a conductor pattern 30 and a residual base material 32, the conductor pattern 30 now being connected to the substrate materials 14 by the adhesive 18.

In addition, the advantageous embodiment comprises a cleaning brush 34 and compressed-air cleaning unit 36 which remove the residual base material 32 after the punching and connecting steps. After the removing step, the substrate material 14 is optionally fed, along with the conductor pattern 30, to a laminating assembly 38, here a roll laminating unit, which in turn comprises, with regard to the representation in FIG. 1, an upper laminating drum 40 and a lower laminating drum 42. Eventually, FIG. 1 shows an optional reel-off unit 44, by means of which the "RFID labels" or RFID antenna patterns 30, which are located on the (contiguous=substrate, may be rolled up.

As is shown in FIG. 1, the conductive base material 10 and the substrate material 14 are provided for production via the reel-off unit 12 and via the reel-off unit 16, respectively, and they are fed in between the punching drum 22 and the counterpressure drum 26 of the punching assembly. Both the conductive base material 10 and the substrate material 14 may naturally also be provided in any other manner than by means of reeling-off. However, the provision via the reel-off units 12 and 16 has the major advantage over other provision possibilities that, e.g., large amounts of foil may be provided for production in a space-saving manner without having to interrupt the process.

As will be explained in more detail below, the conductor pattern 30 may be fully separated from the residual base material 32 along with the punching tool 26, which comprises, e.g. a punching edge or a punching blade, and may also be connected to the substrate material 14 at the same time. Here, the punching blade of the punching tool 26 may be configured, for example, as a knife-type blade, it also being possible to perform the connection by means of adhesion, for example. This step, which further reduces the production costs and wherein the connecting step is performed by the punching step, will be explained below in more detail with reference to FIG. 3.

By connecting the conductor pattern 30 to the substrate material 14, the conductor pattern 30 is fixed for the subsequent production steps of removing and the optional step of laminating. Since the conductor pattern 30 may possibly be connected, until then, to the surface of the substrate material 14 only in the central area, for example by means of an adhesive contact, the surrounding areas are possibly not yet fully connected, or glued, to the substrate material 14. In the removal step, the residual base material 28 is removed, for example, using a cleaning brush 34 and a compressed-air cleaning unit 36. However, any suitable removal methods, such as scraping off by means of a metal blade, may be employed. The conductor pattern 30 is not removed by the cleaning brush 34 or the compressed-air cleaning unit 36 since the conductor pattern 30 was advantageously already firmly connected to the substrate material 14 in the punching step.

To connect, or glue, the resulting conductor pattern 30 completely, or over the whole area, to the surface of the substrate material 24 (in case it has not happened yet), a step of laminating subsequently optionally includes feeding the substrate material 14 comprising the conductor pattern 30 between the upper laminating drum 40 and the lower laminating drum 42 of the lamination assembly 38. Instead of roll lamination, a different laminating method, for example sequential laminating, may also be used. Laminating is performed while applying heat and pressure, it being possible for the heat to be supplied, e.g. in accordance with FIG. 1, from the upper laminating drum 37 and/or the lower laminating drum 38. Of course, the step of connecting the conductor pattern 30 to the substrate material 22 may also be performed, for example, during punching, such that the connection is implemented well enough for the optional laminating step to be unnecessary.

The conductor pattern 30 firmly connected to the substrate material 14 is eventually fed to, e.g., the reel-off unit 44, other receiving assemblies also being possible, of course. In addition, a separating step may also be integrated into the method, so that, e.g., individual RFID labels or RFID antenna patterns may be present, and may be packaged, after the separating step.

A description will be given below of a further alternative embodiment of the inventive method of producing a conductor pattern 30 on a substrate 14, wherein the conductor pattern 30 and the residual base material 32 remain interconnected by one or several mechanical links 48 in the punching step, as will become apparent, for example, with reference to FIG. 2B.

With regard to the following description, one should note that the reference numerals shown in FIG. 1 will again be used (as far as possible) to designate identical or functionally similar elements.

In particular, a method will be described wherein so-called holding ridges 48 continue to exist between the conductor pattern 30 and the residual base material 32 due to incomplete separation during the punching, this procedure also being referred to perforation. In this exemplary method, the conductive base material 10 may now be again fed, e.g., to the punching assembly 20 by a reel-off unit 12, said punching assembly 20 now, however, not fully separating the conductor pattern 30 from the residual base material 32, but patterning the conductive base material 10 such that the holding ridges 48 fix the conductor pattern 30 with regard to the remaining best material 32 so as to be able to feed the conductor pattern 30, in a manner in which it is spatially secured and retains its shape, to the next process step, i.e. connecting the conductor pattern 30 to the substrate material 14.

It becomes evident that in this case, the substrate material 14 can be joined with the patterned, conductive base material 28, which comprises the conductor pattern 30 and the residual base material 32, downstream from the punching assembly 20 only. The connection may be performed, e.g., by means of gluing in a gluing station, which is not depicted in FIG. 1 and follows the punching assembly 20, for example. In contrast to the previously described embodiment, in the alternative procedure, the punching assembly 20 is fed, for example, only the conductive base material 10, and the substrate material 14 is joined with the patterned, conductive base material 28 in the gluing station only. The gluing station may connect, or glue, the conductor pattern 30 to the substrate material using an adhesive 18 and while applying pressure and heat. For example, the adhesive 18 may have already previously been applied to the substrate material 14 and/or to the conductive base material 10 by means of wetting.

An elevation in the form of the conductor pattern 30 may be applied, in the gluing station, for example to an adhesive drum, so that only the conductor pattern 30 gets to contact the surface of the substrate material 14. Optionally, by the elevation of the adhesive drum, the separation of the mechanical links 48 from the residual base material 32 may be effected at the same time. As a result, the residual base material has no, or only a poor, adhesive connection to the surface of the substrate material. Subsequently, the residual base material 32 may simply be "stripped off", for example, in a manner similar to the previously described first advantageous embodiment, or may be removed using a peeling knife or a rotating brush 34.

A further possibility is for the mechanical links 48 to not be separated before the step of removing the residual base material 32 from the conductor pattern 30. Naturally, connection by means of adhesion may also be performed by, e.g., sequential gluing instead of using an adhesive drum. In addition, a different connection technology may be used here instead of connection by means of adhesion. This embodiment of the inventive production method is also suitable both for roll punching and for sequential punching, e.g. by means of a toggle press or a hydraulic press.

The conductor patterns, in particular the RFID antenna patterns, which may be produced by the inventive method are generally considerably smaller than the patterns customary in the paper and/or packaging industries. If the conductor patterns are also, e.g., RFID antenna patterns for an operating frequency of 13.56 MHz, they will necessitate several turns as antenna coils. If such an antenna pattern is patterned, e.g., using a rotary punch, it is also possible, in accordance with the present invention, to transfer this multi-turn coil to the surface of the substrate material in such a manner that it is free from distortion and will retain its precise shape, as will now be illustrated below with reference to the various embodiments described above In the first advantageous embodiment, the punching step comprises fully separating the conductor pattern 30 from the residual base material 32. This is also referred to as cutting. To insure a spatial fixation for the following further processing steps which is free from distortion and provides shape retention, the conductor pattern is secured, e.g. to a carrier medium or by means of an appropriate auxiliary assembly. The carrier medium may be directly the substrate material 14, this corresponds to the first advantageous embodiment, or may be a different one which only serves to temporarily fix the conductor pattern 30 until the step of connecting the conductor pattern 30 to the substrate material 14. The fixation may also be performed by means of gluing, for example.

Figure 2A:
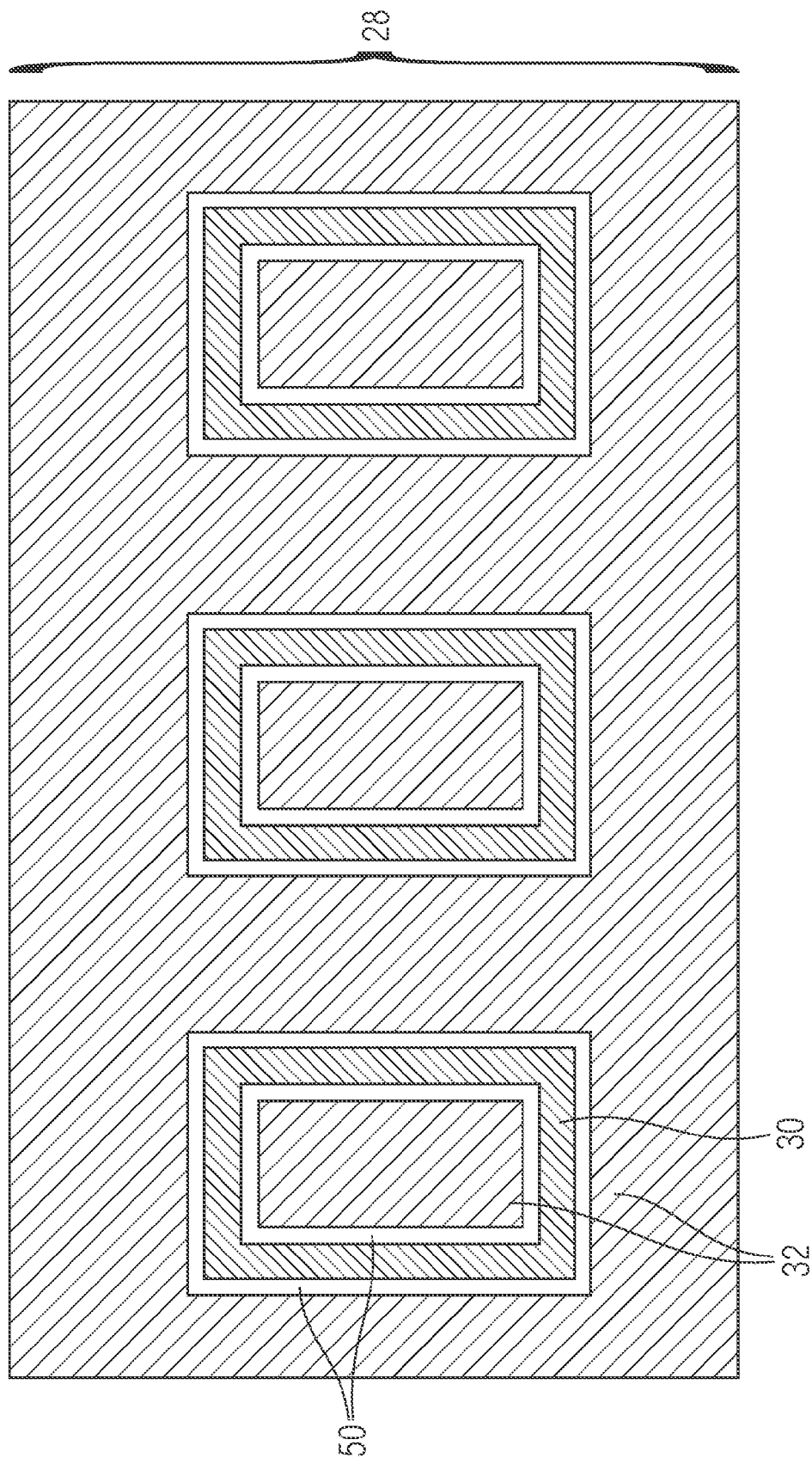
FIGS. 2A-B show a representation of an exemplary, patterned, conductive base material, e.g. in the form of a copper tape, wherein the conductor pattern and the residual base material have been completely separated, or wherein the conductor pattern and the residual base material are connected by means of several mechanical links (holding ridges).

FIG. 2A shows a patterned, conductive base material 10, the conductor pattern 30 and the residual base material 14 having been fully separated by the punching step while forming a partition gap 50. The conductive base material 10 may be copper, for example, and may be provided in the form of a copper tape. The conductive base materials 10 may be metals or non-ferrous metals, for example, and may comprise, in particular, copper, aluminum, silver, or gold. As was already illustrated with reference to FIG. 1, the punching step may already cause the conductor pattern 30 to be connected to the substrate material 14, i.e. the punching and connecting steps are performed together (simultaneously).

Figure 2B:
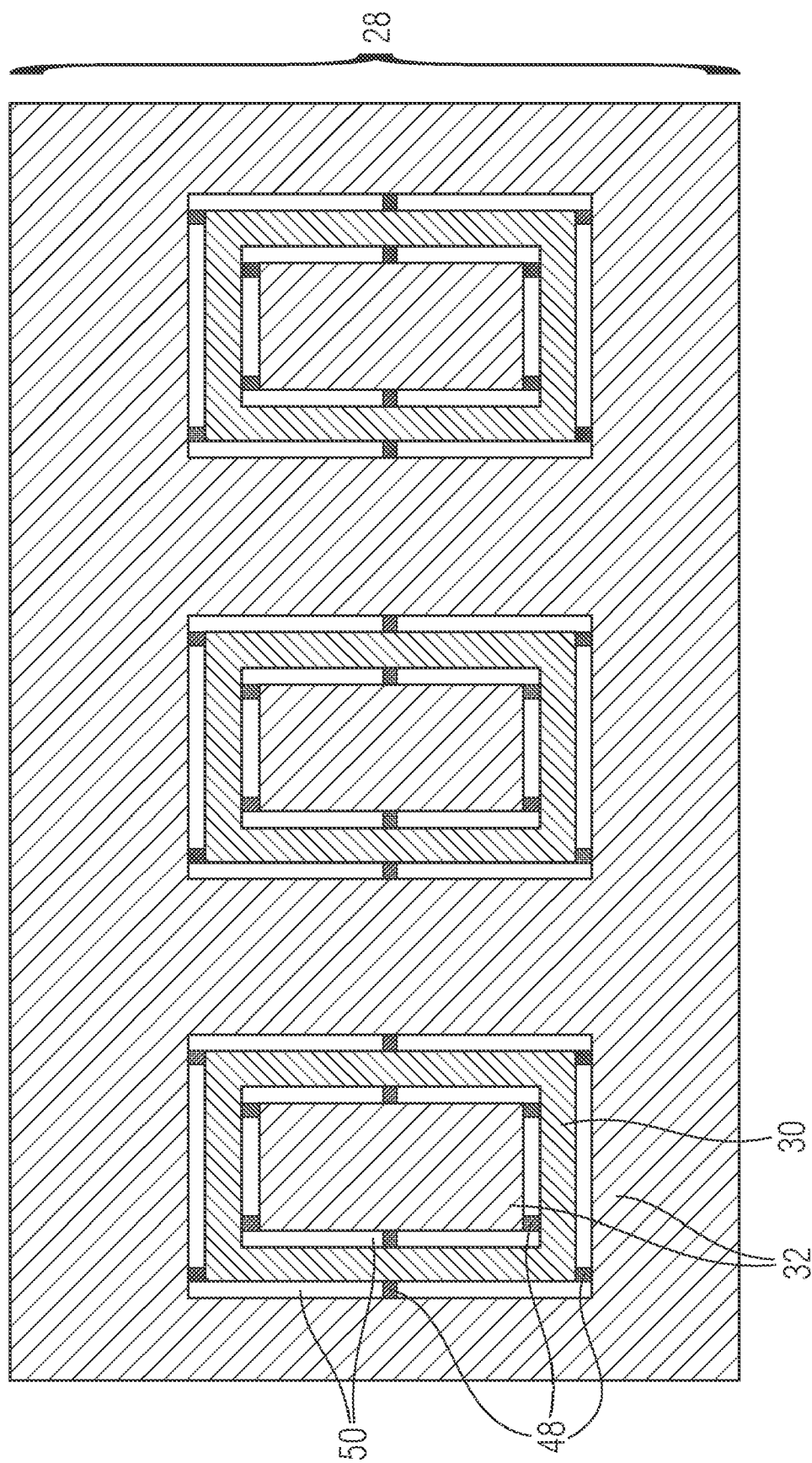

FIG. 2B alternatively shows a patterned, conductive base material 28, the conductor pattern 30 and the residual base material 32 being interconnected by several mechanical links 48, in this case, holding ridges. The conductive base material 10 may be copper, for example, and may be provided in the form of a copper tape, and/or may comprise the materials indicated in FIG. 2A. In accordance with this alternative, the conductor pattern 30 is now connected to the residual base material 32 only by the mechanical links 48, and is otherwise separated by the partition gap 50. The mechanical links 48 are dimensioned such that they fix the position of the conductor pattern 30 with regard to the residual base material 32, but simultaneously enable the mechanical links 48 to be separated in a simple manner in a subsequent method step.

The mechanical links 48 may be produced either in the punching step, by means of separating the conductor pattern 30 from the residual base material 32 in a "deliberately incomplete" manner. If the mechanical link 48 is produced by means of incomplete separation in the punching step, this procedure is also referred to as perforation, and the mechanical link 48 is also referred to as a holding ridge. This alternative approach is employed in the previously described second embodiment.

The dimensioning of the holding ridges depends on, e.g., the fineness of the conductor pattern, the speed of the production system, and the adhesive power of the adhesive.

Figure 3:
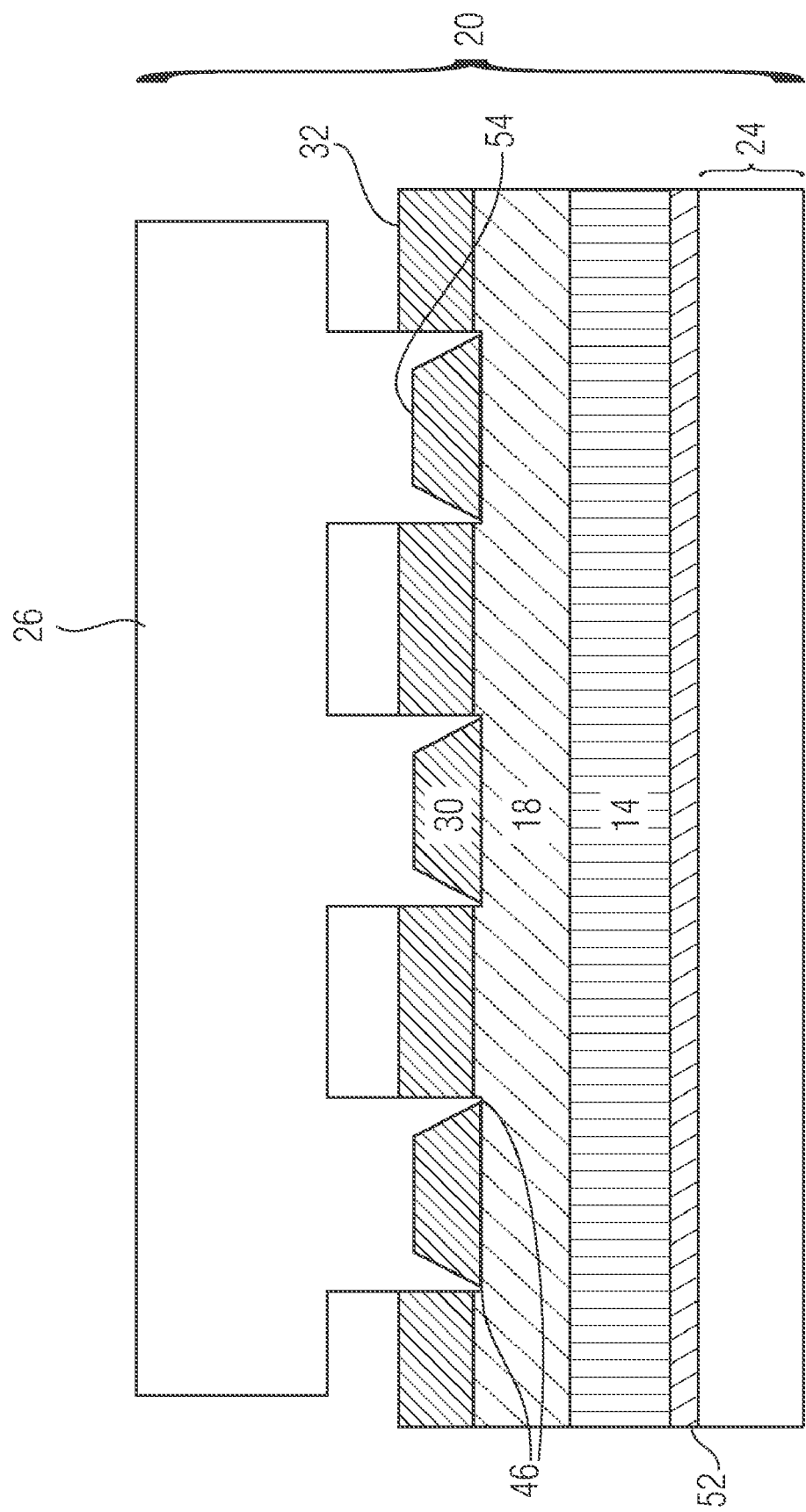
FIG. 3 is a schematic detailed representation of a punching assembly for utilization in the inventive method of producing a pattern on a substrate.

FIG. 3 now shows a schematic representation and mode of operation of an exemplary punching assembly 20 for the punching step, it also being possible here to perform the step of connecting the conductor pattern 30 to the substrate 14 (along) with the punching step. The punching assembly 20 comprises a punching tool 26 and a counterpressure assembly 24. The counterpressure assembly may comprise a coating 52 made of a flexible material, for example a rubber material or a plastic material. The conductor pattern 30 may be connected to the substrate material 14 by gluing. Accordingly, FIG. 3 shows an (optional) adhesive layer 18 between the patterned conductive base material 10, or the conductor pattern 30, and the substrate material 14. The punching tool 26, which has a punching blade 46, is configured such that the conductor pattern 30 is fully patterned and is separated from the residual base material 32 and is glued to the substrate material 14 at the same time. To this end, the punching tool 26 comprises, between the punching blades 46 would punch out the conductor pattern 30, an elevation relative to the laterally erect punching blades 46 so as to establish a two-dimensional adhesive contact with the surface of the substrate material 14. The ratio of the height of the punching blade 46 to the height and the distance of the press-on face 54 of the punching tool 26 is defined by a thickness of the conductor pattern 30 and the adhesive 18 used.

In the alternative inventive procedure, wherein the conductor pattern 30 is not fully separated from the residual base material 32, but wherein a mechanical holding ridge 48 in the form of a perforation is left, the fundamental assembly of the punching tool 26 and the counterpressure assembly 24 may essentially be configured in the same manner as that for complete punching (of FIG. 3), the punching tool 26 only being adapted to retain the holding ridges 48. Advantageously, however, in this case only the conductive base material 10 is introduced into the punching assembly 20, the connection to the substrate material 14 may then be effected in a subsequent process step, e.g. in a gluing station, as has been described.

With reference to FIG. 3, it now becomes evident that with the application of pressure, the punching edge or punching blade 46 of the punching tool 26 may penetrate into the conductive base material 10. To prevent the conductive base material 10 from yielding, a counterpressure assembly 24 is located on the other side, it being typical for both the punching tool 26 and the counterpressure assembly 24 to be advantageously arranged at right angles to the direction of movement of the conductive base material 10 to be punched, and it being possible for both the punch 22 and the counterpressure assembly 24 to be configured either as a drum, i.e. a punching drum and counterpressure drum, or as a sequential drum and/or sequential counterpressure assembly and/or counterpressure plate. The counterpressure assembly 24 typically comprises a flexible coating 52 made of rubber or plastic so as to increase the tool life.

The punching pattern, or master, for a roll punch 20 is either milled or etched into a metal sheet, for example. The use of a metal sheet for producing the punching pattern is particularly suitable in this context since the metal sheet may be wound around the punching cylinder, i.e. the punching drum 22, in a very simple manner. For transferring the punching pattern onto a metal sheet, a sheet film produced using a photo plotter is particularly suitable. In this context, a photo sensitive foil is laminated onto the metal sheet, the sheet film is subsequently placed on top, whereupon the patterns of the sheet film are transferred onto the photosensitive layer using an exposure source. Finally, the exposed areas may cure, and the non-exposed areas may be washed out. Subsequently, the metal surface is etched away, using the etching medium, at those areas which have been laid open by the washing process, and in the end the photomask is removed using a remover solution.

The step of punching the conductor pattern 30 may be conducted by means of different punching tool designs. FIG. 4 shows a schematic representation of an exemplary punching blade 46 of the punching tool 26 in a front view and a side view. The punching blade 46 may now have indentations 56 in a cutting edge 58 so as to produce, in the punching step, the mechanical links 48 between the conductor pattern 30 and the residual base material 32, i.e. to retain them. The punching tool 26, and/or the cutting tool for sequential punching advantageously consists of hoop steel. The punching blades 46 may be inserted, for example, as hoop-steel knives into the grooves of the holding tool. The counterpressure opposed to the punching may be produced by a counterpressure assembly 24, it being possible for the counterpressure assembly 24 to be configured, for example, as a rubberized or plastic-coated counterpressure plate or by a counterpressure assembly having depressions for being able to at least partially receive the punching tool 26 which penetrates the conductive base material 10. A counterpressure assembly 24 having such depressions may be a groove matrix, for example, into which the punching blade(s) 46 may be immersed. The latter is based on a kind of cutting principle, by means of which the knives may operate in a particularly gentle manner and whereby the tool lives may be extended.

In summary, one may thus state that in the inventive method of producing a conductor pattern 30 on a substrate material 14, the step of punching (e.g. by roll punching) and the step of connection by means of gluing may be performed together, for example, it being possible to effect, in the punching step, a complete patterning or a patterning with mechanical links 48 between the conductor pattern 30 and the residual base material 32.

The conductive base material 10 and, thus, the material of the conductor pattern 30 advantageously comprise copper, aluminum, or gold, the substrate material 14 advantageously comprises paper, cardboard or plastics such as PET or polyimide. However, the inventive method may naturally also be applied to any conductive metals or metal alloys, or generally to any conductive materials that may be brought into a punchable form.

Thus, in particular, the inventive production method enables fast and low-cost production of RFID systems and, in particular, RFID labels at a considerably increased throughput. Thus, the inventive production method enables an introduction, which is of economic interest, of RFID labels in the low-cost segment, and considerably increases the competitiveness of RFID systems.

One market segment for which a low-cost production method is mandatory is product labeling, for example.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A method of producing an RFID antenna pattern (RFID=radio frequency identification) on a substrate, comprising:
   providing a conductive base material;
   providing a substrate material;
   punching the conductive base material to acquire a patterned conductive base material including the RFID antenna pattern and a residual base material;
   connecting the RFID antenna pattern to the substrate material by gluing; and
   removing the residual base material by using a peel-off cleaning brush, a metal blade or by a compressed-air cleaning; wherein
   the step of connecting is performed simultaneously with the step of punching by using a punching tool; and
   the punching tool includes an elevated portion between a plurality of punching blades, and during the step of punching, the elevated portion acts as a pressing surface which forms the RFID antenna pattern.

2. The method as claimed in claim 1, wherein the RFID antenna pattern is a multi-turn antenna coil.

3. The method as claimed in claim 1, wherein the RFID antenna pattern and the residual base material are completely separated by the punching.

4. The method as claimed in claim 1, wherein the step of punching comprises the steps of:
   feeding the conductive base material between the punching tool and an associated counterpressure assembly;
   punching the RFID antenna pattern into the conductive base material while applying a counterpressure to the conductive base material by using the counterpressure assembly.

5. The method as claimed in claim 4, wherein the counterpressure assembly comprises a coating of a flexible material.

6. The method as claimed in claim 4, wherein the punching tool comprises a punching edge or punching blade to produce the patterned conductive base material during the punching.

7. The method as claimed in claim 1, wherein the punching tool is a roll punch.

8. The method as claimed in claim 1, wherein the gluing is performed by a using thermoplastic adhesive or a pressure-sensitive adhesive.

9. The method as claimed in claim 1, further comprising: laminating the RFID antenna pattern on the substrate material.

10. The method as claimed in claim 9, wherein the laminating comprises applying pressure and heat to the RFID antenna pattern and the substrate material.

11. The method as claimed in claim 1, wherein the conductive base material comprises a metal or non-ferrous metal.

12. The method as claimed in claim 1, wherein the substrate material comprises paper material, cardboard material or a plastic material.

13. The method as claimed in claim 1, wherein the conductive base material or the substrate material is provided in the form of foils.

14. The method as claimed in claim 1, wherein the conductive base material comprises a thickness ranging from about 30 µm to about 100 µm.

15. A method of producing a conductor pattern on a substrate, comprising;
   providing a conductive base material;
   providing a substrate material;
   punching the conductive base material to obtain a patterned conductive base material including the conductor pattern and a residual base material;
   connecting the conductor pattern to the substrate material by gluing; wherein
   the step of connecting is performed simultaneously with the step of punching by using a punching tool; and
   the punching tool includes an elevated portion between a plurality of punching blades, and during the step of punching, the elevated portion acts as a pressing surface which forms the conductor pattern.

16. The method as claimed in claim 15, wherein the conductor pattern and the residual base material are completely separated by the punching.

* * * * *